United States Patent
Yoshino

(10) Patent No.: US 8,947,159 B2
(45) Date of Patent: Feb. 3, 2015

(54) REFERENCE VOLTAGE GENERATION CIRCUIT

(71) Applicant: Seiko Instruments Inc., Chiba (JP)

(72) Inventor: Hideo Yoshino, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 14/183,897

(22) Filed: Feb. 19, 2014

(65) Prior Publication Data

US 2014/0240038 A1 Aug. 28, 2014

(30) Foreign Application Priority Data

Feb. 22, 2013 (JP) .................................. 2013-033602
Dec. 25, 2013 (JP) .................................. 2013-267699

(51) Int. Cl.
*G05F 3/26* (2006.01)
*H03K 3/011* (2006.01)

(52) U.S. Cl.
CPC ...................................... *H03K 3/011* (2013.01)
USPC ............................ 327/543; 327/513; 323/313

(58) Field of Classification Search
None
See application file for complete search history.

(56) References Cited

U.S. PATENT DOCUMENTS

| 5,296,801 A * | 3/1994 | Ohtsuka et al. ............... 323/313 |
| 5,663,589 A * | 9/1997 | Saitoh et al. .................. 257/401 |
| 6,798,277 B2 * | 9/2004 | Nakashimo et al. .......... 327/541 |
| 7,719,346 B2 * | 5/2010 | Imura ........................... 327/538 |

OTHER PUBLICATIONS

Patent Abstracts of Japan, Publication No. 59-200320, Publication Date Nov. 13, 1984.

* cited by examiner

*Primary Examiner* — Lincoln Donovan
*Assistant Examiner* — Terry L Englund
(74) *Attorney, Agent, or Firm* — Adams & Wilks

(57) ABSTRACT

Provided is a reference voltage generation circuit that has a flat temperature characteristic even when there are fluctuations in manufacturing step. After a semiconductor manufacturing process is finished, electrical characteristics of a semiconductor device are evaluated. Temperature characteristic of each reference voltage (VREF) of three unit reference voltage generation circuits (10) is evaluated. Then only a unit reference voltage generation circuit (10) having the most flat temperature characteristics is selected from among the three unit reference voltage generation circuits (10). Only fuses (13, 14) of the selected unit reference voltage generation circuit (10) are not cut, but other fuses (13, 14) are cut. Accordingly only the selected unit reference voltage generation circuit (10) operates, and the other unit reference voltage generation circuits (10) do not operate.

8 Claims, 4 Drawing Sheets

(A)

(B)

REFERENCE VOLTAGE GENERATION CIRCUIT

BACKGROUND OF THE INVENTION

1. Field of the Invention

The present invention relates to a reference voltage generation circuit mounted on a semiconductor device, for generating a reference voltage.

2. Description of the Related Art

In recent years, advanced electronic devices have been marketed all over the world and used in various environments. For example, electronic devices are used also in frigid and heavy snowfall areas, tropical areas right on the equator, and other areas. The electronic devices are required to operate normally in almost any temperature environment of human life. Characteristics of a semiconductor device mounted on an electronic device are thus required not to change due to temperature. One reason for deterioration of temperature characteristics of such semiconductor device is that a reference voltage generated by a reference voltage generation circuit in the semiconductor device changes due to temperature.

A related-art reference voltage generation circuit is described with reference to FIG. 4.

The reference voltage generation circuit includes a depletion type NMOS transistor (D-type NMOS transistor) 91 and an enhancement type NMOS transistor (E-type NMOS transistor) 92. The D-type NMOS transistor 91 has a gate connected to a source thereof so as to function as a constant current circuit. The E-type NMOS transistor 92 is diode-connected. Those transistors are connected in series between a power supply terminal and a ground terminal. The D-type NMOS transistor 91 supplies a constant current to the E-type NMOS transistor 92. This constant current generates a reference voltage VREF at a drain of the E-type NMOS transistor 92.

In this case, the reference voltage VREF is determined by threshold voltages of those transistors and the sizes thereof. Japanese Patent Application Laid-open No. Sho 59-200320 (FIG. 3 and Expression (3)) describes that, by adjusting the sizes of those transistors, temperature dependence of the reference voltage VREF can be reduced.

However, the reference voltage generation circuit disclosed in Japanese Patent Application Laid-open No. Sho 59-200320 has a problem in that the threshold voltages of the transistors may fluctuate due to fluctuations in manufacturing step in a semiconductor manufacturing process and the reference voltage VREF may change due to temperature.

SUMMARY OF THE INVENTION

The present invention has been made in view of the above-mentioned problem, and it is an object thereof to provide a reference voltage generation circuit that has flat temperature characteristics even when there are fluctuations in manufacturing step.

In order to solve the above-mentioned problem, according to one embodiment of the present invention, there is provided a reference voltage generation circuit mounted on a semiconductor device, for generating a reference voltage. The reference voltage generation circuit includes a plurality of unit reference voltage generation circuits, each of which includes: a depletion type NMOS transistor for generating a constant current, which includes a gate doped with N-type impurities and connected to a source thereof; an enhancement type NMOS transistor, which includes a gate doped with P-type impurities, has the same channel impurity profile as a channel impurity profile of the depletion type NMOS transistor, and is diode-connected in series to the depletion type NMOS transistor; a first current interruption circuit for interrupting a current; and a second current interruption circuit provided between a drain of the enhancement type NMOS transistor and a reference voltage terminal. The plurality of unit reference voltage generation circuits has different channel impurity profiles and is connected in parallel.

According to one embodiment of the present invention, even when there are fluctuations in manufacturing step in a semiconductor manufacturing process and when the reference voltages of the plurality of unit reference voltage generation circuits each fluctuate in the reference voltage generation circuit, only a unit reference voltage generation circuit having the most flat temperature characteristics is selected to operate. Consequently, the reference voltage generation circuit can have flat temperature characteristics.

DETAILED DESCRIPTION OF THE INVENTION

Figure 1:
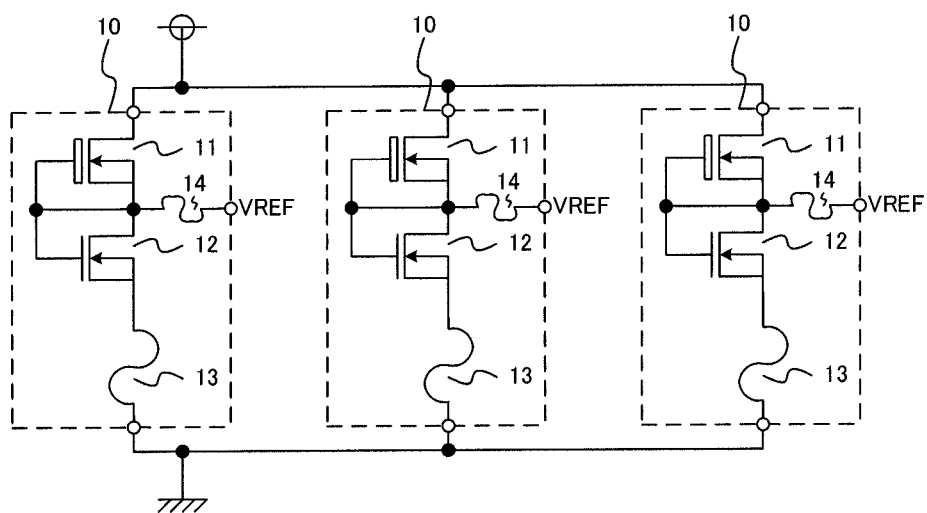
FIG. 1 is a diagram illustrating a reference voltage generation circuit according to one embodiment of the present invention.

Exemplary embodiments of the present invention are described below with reference to the accompanying drawings.

First, a configuration of a reference voltage generation circuit is described below with reference to FIG. 1.

The reference voltage generation circuit includes three unit reference voltage generation circuits 10.

Each of the unit reference voltage generation circuits 10 includes a depletion type NMOS transistor (D-type NMOS transistor) 11, an enhancement type NMOS transistor (E-type NMOS transistor) 12, and fuses 13 and 14.

In the reference voltage generation circuit, power supply terminals of the three unit reference voltage generation circuits 10 are each connected to a power supply terminal of a semiconductor device. Ground terminals of the three unit reference voltage generation circuits 10 are each connected to a ground terminal of the semiconductor device. In other words, the three unit reference voltage generation circuits 10 are connected in parallel between the power supply terminal and the ground terminal of the semiconductor device.

In each of the unit reference voltage generation circuits 10, a gate, a source, and a substrate potential of the D-type NMOS transistor 11 are connected to a reference voltage terminal of the unit reference voltage generation circuit 10 via the fuse 14, and a drain thereof is connected to the power supply terminal of the unit reference voltage generation circuit 10. In other words, the D-type NMOS transistor 11 is connected so as to function as a constant current circuit. A gate and a drain of the E-type NMOS transistor 12 are connected to the reference voltage terminal of the unit reference voltage generation circuit 10 via the fuse 14, and a source and a substrate potential thereof are connected to the ground terminal of the unit reference voltage generation circuit 10 via the fuse 13. In other words, the E-type NMOS transistor 12 is diode-connected. Further, the D-type NMOS transistor 11, the E-type NMOS transistor 12, and the fuse 13 are connected in series.

Next, a method of manufacturing the reference voltage generation circuit is described below.

In each of the unit reference voltage generation circuits 10, both channels of the D-type NMOS transistor 11 and the E-type NMOS transistor 12 are doped with the same impurities in the same amount in the same environment. In other words, the D-type NMOS transistor 11 and the E-type NMOS transistor 12 have the same channel impurity profile. After that, a gate insulating film and a gate electrode made of polysilicon are formed on both the channels. After that, the gate of the D-type NMOS transistor 11 is doped with N-type impurities to have N-type conductivity. Further, the gate of the E-type NMOS transistor 12 is doped with P-type impurities to have P-type conductivity. Accordingly, although the D-type NMOS transistor 11 and the E-type NMOS transistor 12 are different in transistor type, namely the depletion type and the enhancement type, because the channel doping into the semiconductor substrate under the gate insulating film is the same therebetween, the D-type NMOS transistor 11 and the E-type NMOS transistor 12 have substantially the same device characteristics and hence have substantially the same temperature dependence of the device characteristics.

In this case, in the reference voltage generation circuit, the three unit reference voltage generation circuits 10 are provided, and the channel doping is set to be different among the three unit reference voltage generation circuits 10. In other words, three unit reference voltage generation circuits 10 having different channel impurity profiles are provided.

Next, an operation of the unit reference voltage generation circuit 10 is described below.

When the fuses 13 and 14 are not cut, the D-type NMOS transistor 11 supplies a constant current to the E-type NMOS transistor 12. This constant current generates the reference voltage VREF at the drain of the E-type NMOS transistor 12.

When the fuses 13 and 14 are cut, the D-type NMOS transistor 11 does not supply a constant current to the E-type NMOS transistor 12. In other words, the unit reference voltage generation circuit 10 does not operate.

Next, the reference voltage VREF to be output from the reference voltage generation circuit is described below.

After a semiconductor manufacturing process is finished, electrical characteristics of the semiconductor device are evaluated. In this case, temperature characteristics of the reference voltages VREF of the three unit reference voltage generation circuits 10 are also each evaluated. Alternatively, temperature characteristics of alternatives to the three unit reference voltage generation circuits 10, which are each provided on a scribe line, are each evaluated. After that, only a unit reference voltage generation circuit 10 having the most flat temperature characteristics is selected from among the three unit reference voltage generation circuits 10. Only the fuses 13 and 14 of the selected unit reference voltage generation circuit 10 are not cut, but the other fuses 13 and 14 are cut. In other words, only the selected unit reference voltage generation circuit 10 operates, but the other unit reference voltage generation circuits 10 do not operate. Consequently, the reference voltage VREF output from the selected unit reference voltage generation circuit 10 serves as the reference voltage VREF output from the reference voltage generation circuit. Then, even when there are fluctuations in manufacturing step in the semiconductor manufacturing process and when the reference voltages VREF of the three unit reference voltage generation circuits 10 each fluctuate in the reference voltage generation circuit, only a unit reference voltage generation circuit 10 having the most flat temperature characteristics is selected to operate, and hence the reference voltage generation circuit can have flat temperature characteristics.

Note that, although three unit reference voltage generation circuits 10 are provided, the present invention is not limited thereto.

Figure 2A:
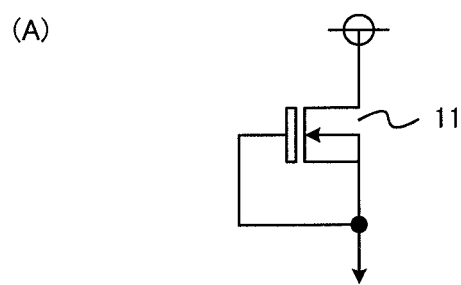
FIG. 2A is a current circuit diagram before modification.
Figure 2B:
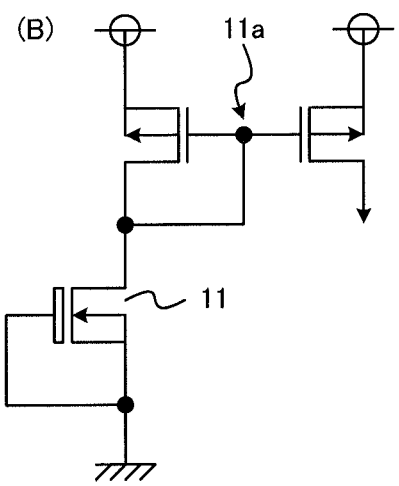
FIG. 2B is a current circuit diagram after modification.

Further, in the constant current circuit formed of the D-type NMOS transistor 11 in the unit reference voltage generation circuit 10, the circuit of FIG. 2A is used in FIG. 1, where an output terminal of the constant current circuit is the source of the D-type NMOS transistor 11. Alternatively, however, as illustrated in FIG. 2B, a circuit including a current mirror circuit 11a may be used, where an output terminal of the constant current circuit is an output terminal of the current mirror circuit 11a.

Figure 5:
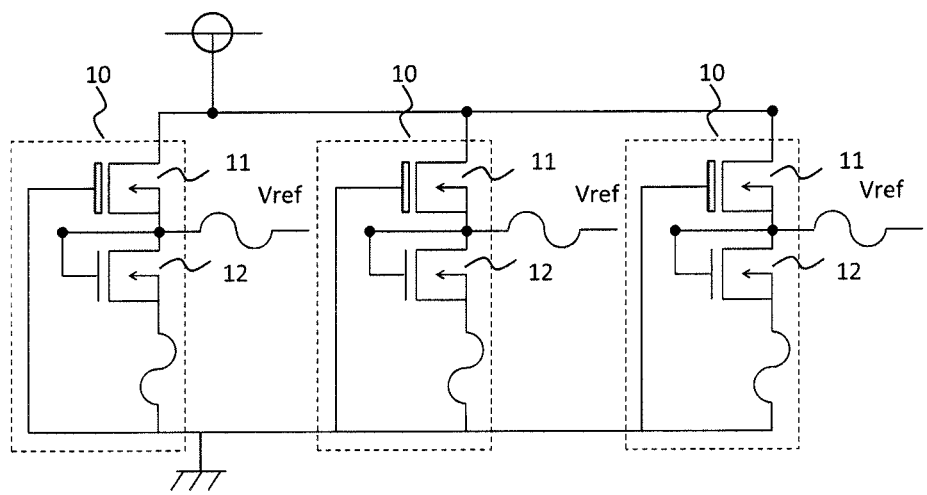
FIG. 5 is a diagram illustrating a reference voltage generation circuit according to another embodiment of the present invention.

Further, in the unit reference voltage generation circuit, the gate of the D-type NMOS transistor 11 may be connected to the substrate potential as illustrated in FIG. 5, which is another embodiment of the present invention.

Further, the fuse 13 in FIG. 1 is provided on the ground terminal side, but although not illustrated, the fuse 13 may be provided on the power supply terminal side.

Figure 3:
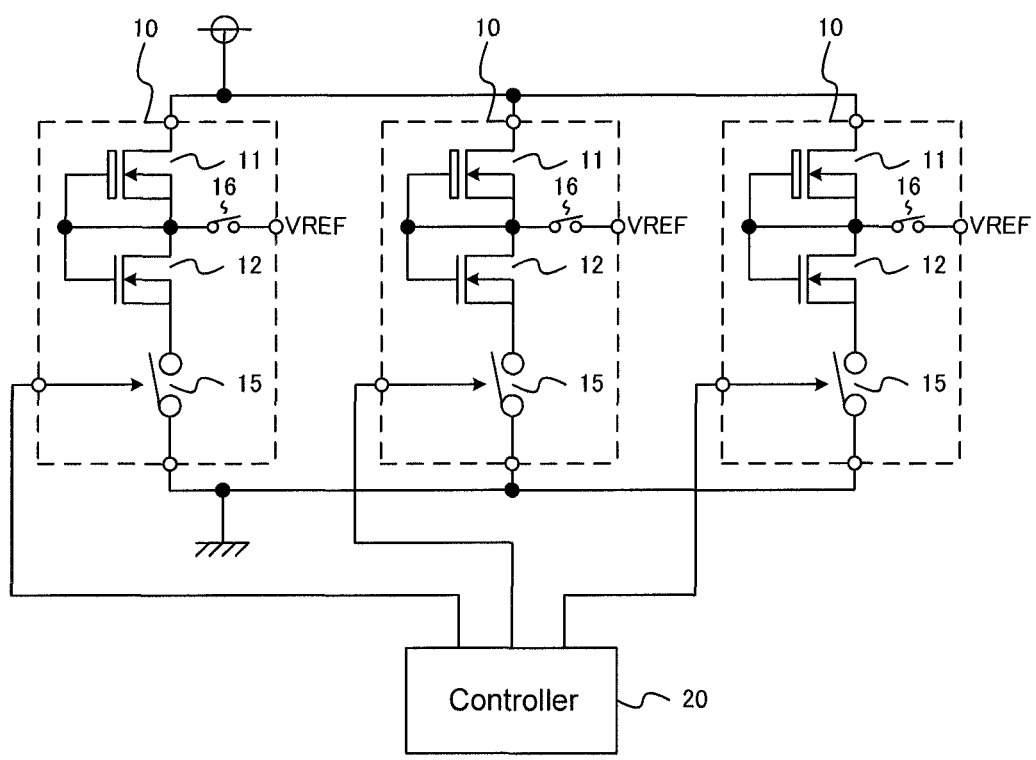
FIG. 3 is a diagram illustrating another reference voltage generation circuit according to one embodiment of the present invention.
Figure 4:
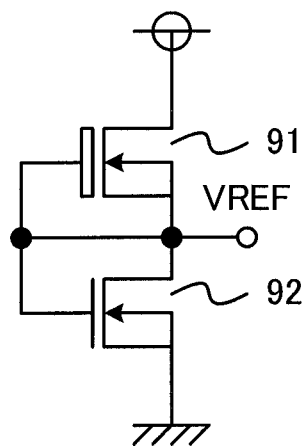
FIG. 4 is a diagram illustrating a related-art reference voltage generation circuit.

Further, each of the fuses 13 and 14 is a current interruption circuit for interrupting a current. As illustrated in FIG. 3, the fuses 13 and 14 may be replaced by switches 15 and 16 formed of MOS transistors. In this case, the reference voltage generation circuit includes three unit reference voltage generation circuits 10 and a control circuit 20. Although not illustrated, the control circuit 20 includes a memory element such as a one-time programmable (OTP) memory element. Based on information of the memory element, the control circuit 20 sends three signals for controlling ON/OFF of the switches 15 and 16 included respectively in the three units of reference voltage generation circuit 10.

Further, the fuse 13 may be omitted when current consumption of an IC can be ignored.

What is claimed is:

1. A reference voltage generation circuit mounted on a semiconductor device, for generating a reference voltage,
   the reference voltage generation circuit comprising a plurality of unit reference voltage generation circuits connected in parallel,
   each of the unit reference voltage generation circuits comprising:
   a constant current circuit for generating a constant current, the constant current circuit comprising a depletion type NMOS transistor, which includes a gate electrode having N-type conductivity and includes a gate and a source connected to each other;
   an enhancement type NMOS transistor, which includes a gate electrode having P-type conductivity and is diode-connected in series to the constant current circuit, the enhancement type NMOS transistor having the same channel impurity profile as a channel impurity profile of the depletion type NMOS transistor;
   a first current interruption circuit for interrupting a current, which is connected in series to the constant current circuit and the enhancement type NMOS transistor; and
   a second current interruption circuit provided between a drain of the enhancement type NMOS transistor and a reference voltage terminal,
   the plurality of unit reference voltage generation circuits having different channel impurity profiles.

2. A reference voltage generation circuit according to claim 1, wherein the constant current circuit includes a source of the depletion type NMOS transistor as an output terminal of the constant current circuit.

3. A reference voltage generation circuit according to claim 1, wherein:
the constant current circuit further includes a current mirror circuit; and
the constant current circuit includes an output terminal of the current mirror circuit as an output terminal of the constant current circuit.

4. A reference voltage generation circuit according to claim 1, wherein the first current interruption circuit and the second current interruption circuit each comprise a fuse.

5. A reference voltage generation circuit according to claim 1, wherein the first current interruption circuit and the second current interruption circuit each comprise a switch formed of a MOS transistor.

6. A reference voltage generation circuit mounted on a semiconductor device, for generating a reference voltage,
the reference voltage generation circuit comprising a plurality of unit reference voltage generation circuits connected in parallel,
each of the unit reference voltage generation circuits comprising:
a current output circuit for generating a current, the current output circuit comprising a depletion type NMOS transistor, which includes a gate electrode having N-type conductivity and includes a source connected to have a potential higher than a potential of the gate;
an enhancement type NMOS transistor, which includes a gate electrode having P-type conductivity and is diode-connected in series to the current output circuit, the enhancement type NMOS transistor having the same channel impurity profile as a channel impurity profile of the depletion type NMOS transistor;
a first current interruption circuit for interrupting a current, which is connected in series to the current output circuit and the enhancement type NMOS transistor; and
a second current interruption circuit provided between a drain of the enhancement type NMOS transistor and a reference voltage terminal,
the plurality of unit reference voltage generation circuits having different channel impurity profiles.

7. A reference voltage generation circuit according to claim 6, wherein:
the current output circuit includes a source of the depletion type NMOS transistor as an output terminal of the current output circuit; and
the gate electrode of the current output circuit is connected to a substrate.

8. A reference voltage generation circuit mounted on a semiconductor device, for generating a reference voltage,
the reference voltage generation circuit comprising a plurality of unit reference voltage generation circuits connected in parallel,
each of the unit reference voltage generation circuits comprising:
a constant current circuit for generating a constant current, the constant current circuit comprising a depletion type NMOS transistor, which includes a gate electrode having N-type conductivity and includes a gate and a source connected to each other;
an enhancement type NMOS transistor, which includes a gate electrode having P-type conductivity and is diode-connected in series to the constant current circuit, the enhancement type NMOS transistor having the same channel impurity profile as a channel impurity profile of the depletion type NMOS transistor; and
a first current interruption circuit for interrupting a current, which is connected in series to the constant current circuit and the enhancement type NMOS transistor,
the plurality of unit reference voltage generation circuits having different channel impurity profiles.

* * * * *